US006987427B2

(12) United States Patent
Mattsson et al.

(10) Patent No.: US 6,987,427 B2
(45) Date of Patent: Jan. 17, 2006

(54) METHOD FOR TUNING A RADIO FILTER, A RADIO FILTER AND A SYSTEM COMPRISING SUCH A RADIO FILTER

(75) Inventors: Thomas Mattsson, Taby (SE); Anders Jansson, Taby (SE)

(73) Assignee: Allgon AB, Taby (SE)

( * ) Notice: Subject to any disclaimer, the term of this patent is extended or adjusted under 35 U.S.C. 154(b) by 88 days.

(21) Appl. No.: 10/433,607

(22) PCT Filed: Dec. 12, 2001

(86) PCT No.: PCT/SE01/02758

§ 371 (c)(1),
(2), (4) Date: Oct. 31, 2003

(87) PCT Pub. No.: WO02/49213

PCT Pub. Date: Jun. 20, 2002

(65) Prior Publication Data

US 2004/0061567 A1 Apr. 1, 2004

(30) Foreign Application Priority Data

Dec. 15, 2000 (SE) .............................. 0004658

(51) Int. Cl.
*H03J 7/18* (2006.01)

(52) U.S. Cl. ..................................... 333/17.1; 455/125
(58) Field of Classification Search .............. 333/17.1, 333/175, 235; 375/304; 455/121, 123, 125, 455/193.1, 193.2
See application file for complete search history.

(56) References Cited

U.S. PATENT DOCUMENTS 3,715,690 A * 2/1973 Young et al. ............. 333/17.1

| 4,692,724 | A | | 9/1987 | Harris | 333/202 |
| 5,065,121 | A | * | 11/1991 | Ghadaksaz | 333/235 |
| 5,525,940 | A | | 6/1996 | Heikkila et al. | 333/17 |
| 5,638,034 | A | | 6/1997 | Heikkila et al. | 333/17 |
| 6,041,083 | A | | 3/2000 | Larsson et al. | 375/304 |
| 6,147,577 | A | | 11/2000 | Cavey | 333/209 |

FOREIGN PATENT DOCUMENTS

| GB | 1253306 | 11/1971 |
| WO | WO00/64052 | 10/2000 |

OTHER PUBLICATIONS

Atia et al, Microwave Symposium Digest 2000 IEEE, pp. 1637–1640 vol. 3, Tuning and measurements of couplings and resonant frequences for Cascaded Resonators 2000.

* cited by examiner

*Primary Examiner*—Seungsook Ham
(74) *Attorney, Agent, or Firm*—Jacobson Holman PLLC

(57) ABSTRACT

The present invention relates to a method for tuning a radio filter. The filter comprises an input connection, an output connection and at least two resonator modules coupled in cascade, each having a running mechanism and a probe. A first resonator module is connected to the input connection and a final resonator module is connected to the output connection. The filter is adapted to receive at least one signal within a frequency range. The method comprises essentially two steps: coarse tuning, which is dependent on the frequency content of the received signal(s), and fine tuning, which is dependent on a calculated deviation between a set value vector and a measured signal parameter vector. A relationship between the set value vector and the signal parameter vector is established for calculating the deviation. The invention also relates to a radio filter and a system comprising such a radio filter.

19 Claims, 8 Drawing Sheets

METHOD FOR TUNING A RADIO FILTER, A RADIO FILTER AND A SYSTEM COMPRISING SUCH A RADIO FILTER

This is a nationalization of PCT/SE01/02758 filed Dec. 12, 2001 and published in English.

TECHNICAL FIELD

The present invention relates to a method for tuning a radio filter, especially a radio filter comprising cascade coupled resonator modules. The invention also relates to a radio filter and a system comprising such a radio filter.

BACKGROUND AND RELATED ART OF THE INVENTION

The control system in present auto tuned combiners works independently for each resonator module (channel), the phase is measured in each resonator module and the position of the tuning mechanism is adjusted accordingly. In U.S. Pat. No. 6,041,083, by Larsson et al., the processing is done in one control unit, switching between channels, but the measured data and response is for one channel at a time, see FIG. 1.

The problem with the described control system is that it requires a one-to-one correspondence between the position of the tuning mechanism in a certain resonator module and the measured phase. When resonator modules are coupled in cascade, this one-to-one correspondence is no longer possible to find.

A tunable filter is described in U.S. Pat. No. 6,147,577, by W. W. Cavey, which demands an extremely stable environment to operate properly. The described filter has a built-in fault in that the filter doesn't have any possibilities to adjust it self over time, for instance to compensate for temperature drifts.

In U.S. Pat. No. 5,525,940, by Heikkilä et al., and U.S. Pat. No. 5,638,034, by Heikkilä et al., a device and a method for tuning a combiner filter is disclosed. The technique used is tuning on measurement of mainly reflected power from the resonator module.

SUMMARY OF THE INVENTION

The present invention seeks to provide a method for tuning a radio filter comprising at least two cascade coupled resonator modules that automatically tunes the filter in response to the input signal to the filter.

According to an aspect of the present invention there is provided a method for tuning a radio filters specified by claim 1.

The invention is also directed to a radio filter.

The invention is further directed to a system comprising a radio filter.

An advantage with the present invention is that the cost for manufacturing radio filters for different operating frequencies, and systems comprising a filter, is reduced since one filter can be used for said different operating frequencies.

Another advantage with the present invention is that the method allows radio filters to be easily tuned, for a specific frequency, in the field, as a response to the input signal(s).

Still another advantage is that the radio filter easily may be tuned to another frequency during operation.

Still another advantage is that the method provides a radio filter to be, during normal operation, adjusted in response to external influence, such as temperature drifts, aging, air humidity, external force.

DETAILED DESCRIPTION OF PREFERRED EMBODIMENTS

Figure 1:
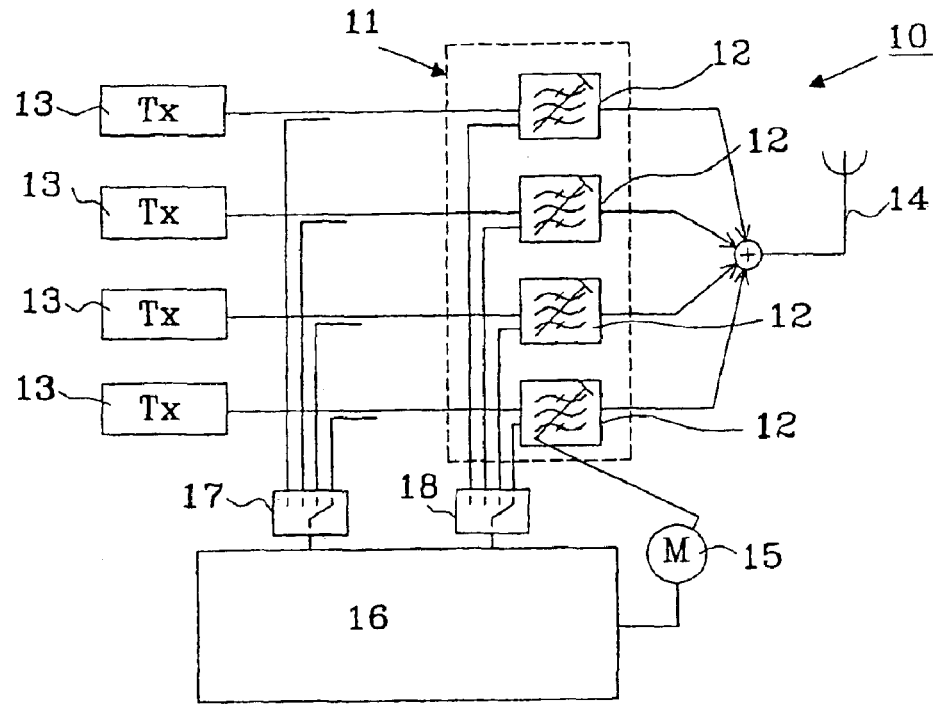
FIG. 1 shows a filter according to prior art.

FIG. 1 shows a system 10 including a prior art radio filter 11, which in this example comprises four separate resonator modules 12. The system 10 further includes a transmitter circuit 13 for each resonator module 12, where a signal from each transceiver circuit 13 is fed into the corresponding resonator module 12 and output signals from all resonator modules are added together and sent to an antenna 14.

Each resonator module 12 also includes a separate tuning mechanism 15 (only one tuning mechanism is shown for clarity), and each resonator module is independently tuned by a control unit 16. The signal from each transceiver circuit 13 is sensed and the control unit 16 selects which sensed signal is to be fed into the control unit 16, by setting a signal switch 17 in the desired position. In this example the signal fed into the forth resonator module is sensed by the control unit 16.

A probe (not shown) is provided in each resonator module, which are connected to a probe switch 18. The probes are used to detect the signal within each resonator module, especially when the resonator module 12 is tuned. The signal switch 17 and the probe switch 18 are set in the same position, in this example the fourth position, which means that the signal fed into the fourth resonator module and the signal from the same resonator module are used in the control unit 16 to tune the filter by adjusting the tuning mechanism 15.

The phase value of the signal within each resonator module 12 is used when performing the tuning, since there is a very well defined relationship between the phase of the signal and the position of the tuning mechanism. Each resonator module is tuned to a specific frequency, which corresponds to a specific phase value of the signal within the resonator module. The tuning is performed by measuring the phase value and adjusting the tuning mechanism until the measured phase value corresponds to the desired frequency, i.e. the specific phase value.

Figure 2:
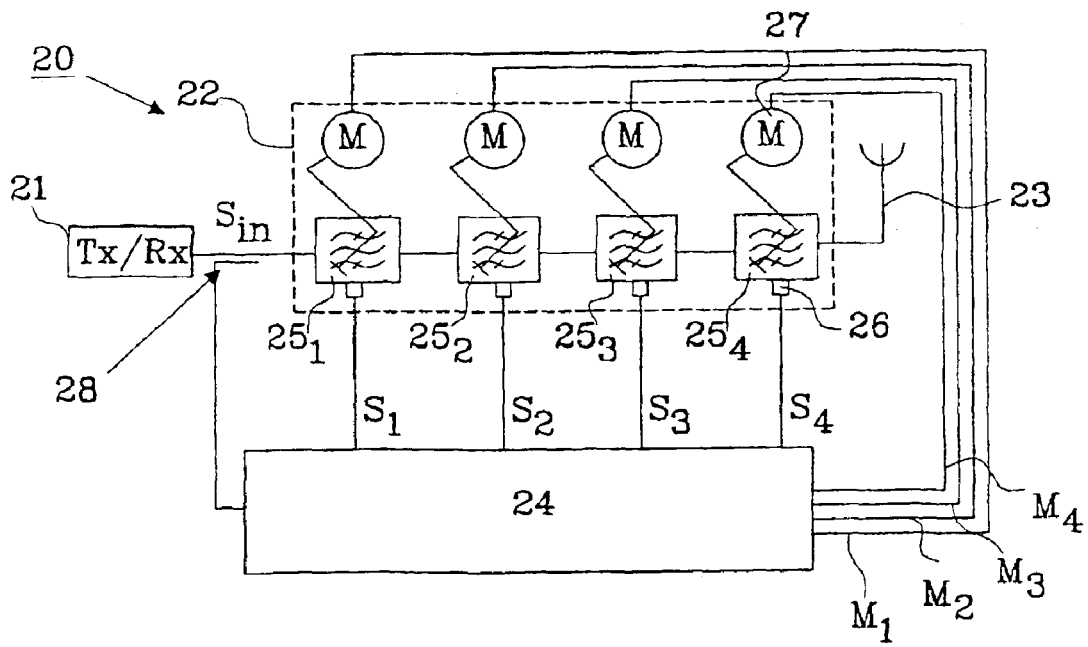
FIG. 2 shows a first embodiment of a filter according to the invention.

FIG. 2 shows a first embodiment of a system 20 comprising a transceiver circuit 21 connected to a radio filter 22 according to the invention, an antenna 23 connected to an output from the radio filter 22 and a control unit 24. The filter comprises at least two resonator modules 25 coupled in cascade, in this embodiment there is four resonator modules $25_1$–$25_4$ coupled in cascade. Each resonator module 25 being provided with a probe 26 and a tuning mechanism 27.

A sensor 28 is connected to the control unit 24, which detects if there is any signal $S_{in}$ coming from the transceiver circuit 21 and furthermore senses the frequency content of signal $S_{in}$. The frequency content is used in the control unit to determine the filter frequency, i.e. around which frequency the filter should operate, and as a reference to the measured signals from the probes.

Each probe 26 is used for measuring a signal parameter, e.g. phase or amplitude, at the resonator module, and is connected to the control unit 24 as input signals $S_1$–$S_4$ from each resonator module 25. The control unit provides control signals $M_1$–$M_4$ to the four tuning mechanisms 27.

Figure 5:
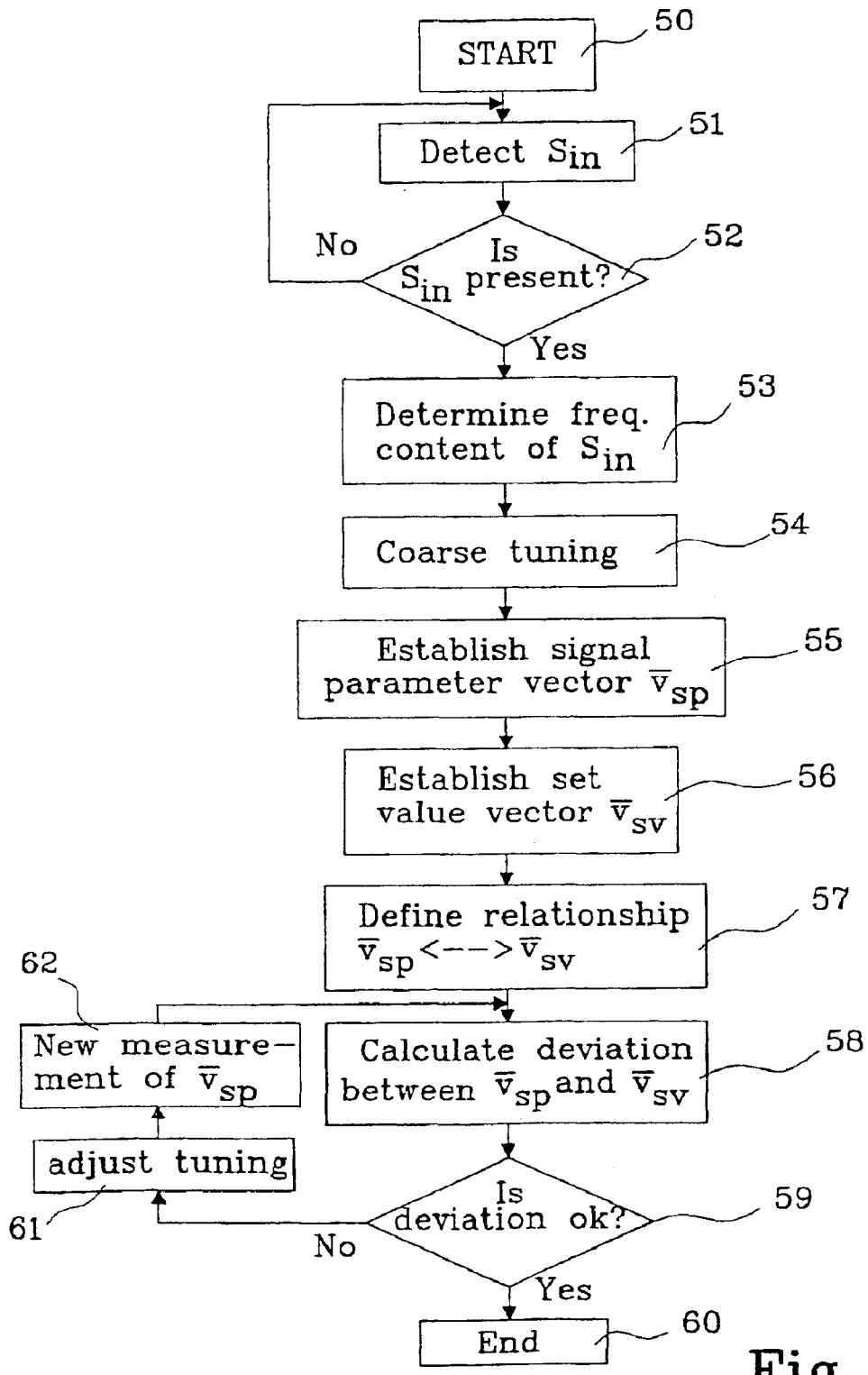
FIG. 5 shows a flow diagram illustrating a method for tuning a filter according to the invention.
Figure 6:
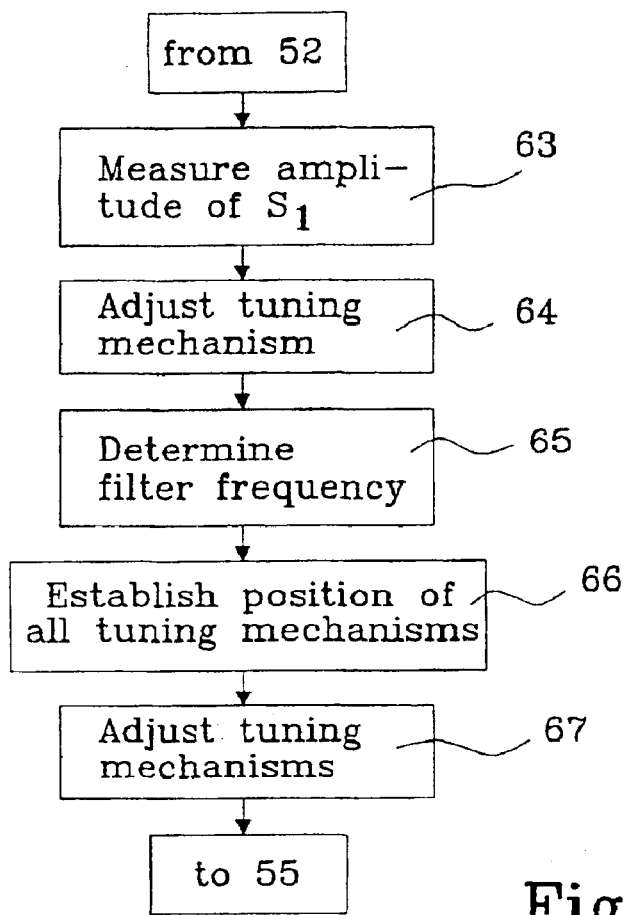
FIG. 6 shows a flow diagram of a first embodiment for coarse tuning a filter according to the invention.

The input signals $S_{in}$, $S_1$, $S_2$, $S_3$, $S_4$ are used to calculate the control signals, which in turn control each tuning mechanism so that the resonator module may be tuned. The tuning is normally performed in two steps, coarse tuning and fine tuning. There are several possible ways of achieving these two steps as illustrated in FIGS. 5–6.

The major difference between the described filter in FIG. 2 and the prior art in FIG. 1 is that the resonator modules are connected in cascade. This difference makes it possible to achieve a filter with a desired filter characteristic, e.g. with high roll-off.

Figure 3:
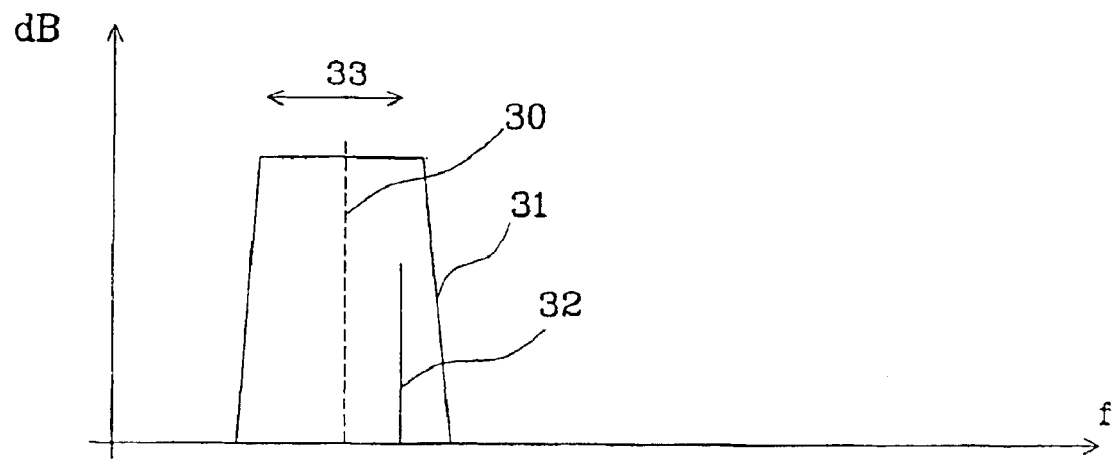
FIG. 3 shows a frequency diagram illustrating the principle of the invention.

FIG. 3 shows a frequency diagram illustrating the principle of the invention. The x-axis is frequency f and the y-axis is transmission in dB. The dashed line 30 denotes the filter frequency. This is usually the center frequency around which the filter characteristics 31 are centered.

When an input signal is fed into the filter, a control unit senses that a signal is present and collects information regarding the frequency content of the signal. This information may be provided as an external signal or determined from the frequency content of the sensed signal.

This information is illustrated as a filter frequency parameter 32, which in this case is a discrete frequency.

The filter characteristic, and thus the filter frequency 30, thereafter automatically moves, as illustrated by the arrows 33, so that the input signal ends up a predetermined distance from the filter frequency 30. Normally the filter frequency 30 overlap the input signal, but in certain cases there is a need to use an offset between them to shift the filter characteristics as described in connection with FIG. 4.

If the input signal is a broad band signal having a carrier signal, the filter frequency parameter 32 may be determined from the average frequency of the input signal or from the carrier frequency.

There is no need for the filter frequency parameter 32 to be within the filter characteristics, as long as the filter frequency parameter 32 may be used to make sure the input signal will be within the filter characteristics when the filter is correctly tuned.

Figure 4:
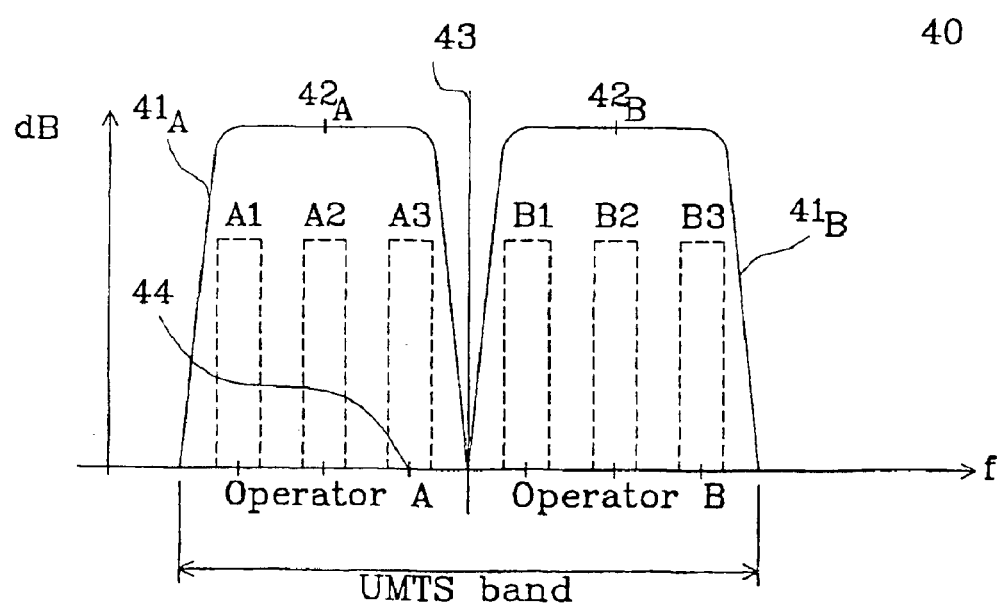
FIG. 4 shows a frequency diagram illustrating an embodiment according to the invention.

FIG. 4 shows a frequency diagram 40 where two filters are present, as illustrated by the filter characteristics curves $41_A$, $41_B$. Each filter has a filter frequency $42_A$, $42_B$, respectively. The x-axis is frequency f and the y-axis is transmission in dB.

If a portion of a UMTS-band is divided into two equal parts, where a first filter characteristics $41_A$ cover the lower part of the portion up to a cut-off frequency 43 and a second filter characteristics $41_B$ cover the upper part of the portion from the cut-off frequency 43. This means that two filters together covers the portion of the UMTS-band and in this example represents two different operators A and B in the UMTS-band. It is essential for operator A not to transmit or receive signals in the frequency range where the operator A operates, and vice versa.

The UMTS-standard allows each operator A, B to handle up to three different channels, if the bandwidth is e.g. 15 MHz, for transmitting/receiving signals A1–A3, B1–B3. All three channels do not have to be used at the same time by the operator.

The tuning system for operator A senses signals in the allotted frequency range and if operator A only uses channel A3 for sending information, there is a problem with prior art systems in that they normally senses the carrier frequency 44 of channel A3, by determining at which frequency the signal has its maximum amplitude, and lock the filter frequency $42_A$ to the carrier frequency 44. This will cause signals to leak into operator B's allotted frequency range. This is unacceptable for operator B.

The present filter according to the invention has a built-in ability to avoid this to happen. The filter characteristics may be shifted by introducing an offset between the filter frequency $42_A$ and the carrier frequency 44.

The offset to be used, to achieve a filter characteristic as shown in FIG. 4, may be obtained by subtracting the filter frequency from the carrier frequency. The offset is then used to adjust the tuning mechanisms.

Both filters for operator A and B are identical in their construction, which means that specially, adapted constructions for different frequencies are not necessary. Only the difference in input signal characteristics will determine the filter characteristics for the respective filter.

FIG. 5 shows a flowchart describing the tuning method for a filter according to the invention. The flow starts in box 50 and proceeds to box 51 where the control unit use the input signal $S_{in}$ to detect if there is any signal present on the filter input, box 52. If no signal is present the flow is fed back to box 51 until a signal is detected in box 52, and the flow proceeds to box 53.

In box 53 the control unit determines the frequency content of the detected input signal $S_{in}$, which may be done by measuring the frequency content of $S_{in}$, and thereby determining a filter frequency, by a frequency counter or by measuring the amplitude of the signal $S_1$ from the first resonator module and calculating a filter frequency, as described in connection with FIG. 6. An alternative way of establishing the filter frequency is to provide an external signal to the control unit, where the purpose of the external signal is to provide the control unit with the desired frequency of the filter independent of the incoming signal $S_{in}$.

The flow in FIG. 5 continues to box 54 where coarse tuning is performed using the filter frequency determined in the previous step. This step may comprise of a calculation step, where the filter frequency is used to determine the position of the tuning mechanisms, as described in connection to FIG. 6. It may also comprise of tuning steps, where a measured parameter of the received signal in each cavity is used to make sure a signal pass through the filter, as described in connection to FIG. 7.

After coarse tuning is done, a signal is present within each resonator modules, which means that a signal parameter, such as amplitude or phase, may be measured at each resonator module. The signal parameter may be measured at the input, the output or inside each resonator module. In the described examples the signal parameter is measured inside the resonator module. The signal parameter is preferably the phase component of the signal.

When the flow continues to box 55, a signal parameter vector $\bar{v}_{sp}$ is established by measuring the phase component of the signal within each resonator module. The measured phase components are combined into the vector. Normally a phase reference is needed to establish each phase component and the reference is preferably established by measuring the phase component of the detected signal in box 51. This phase reference value is stored in a memory in the control unit.

The flow continues to box 56 where a set value vector $\bar{v}_{sv}$ is established. This step comprises normally of retrieving the set value vector from the memory within the control unit, and the stored set value vector $\bar{v}_{sv}$ is determined before hand.

The stored set value vector $\bar{v}_{sv}$ is normally frequency dependent, and is preferably expressed as a frequency dependent polynomial or lookup table. However, it is possible to use a frequency independent set value vector within a small frequency range.

The flow continues to box 57 where a relationship between the signal parameter vector $\bar{v}_{sp}$ and the set value vector $\bar{v}_{sv}$ is defined. The relationship may be defined by using computer simulations, estimations and/or mathematical models. An alternative way of establishing the relationship is to make measurements on a filter when changing the tuning mechanisms in each resonator module as described in connection with FIG. 8.

The relationship between the signal parameter vector $\bar{v}_{sp}$ and the set value vector $\bar{v}_{sv}$ is preferably arranged into a matrix. The relationship is preferably defined before the tuning of the filter commence, but may take place during the fine tuning procedure. If the relationship is defined before the tuning, the relationship is stored in the memory in the control unit and the step of defining the relationship comprises of retrieving the relationship from the memory.

When the signal parameter vector $\bar{v}_{sp}$, the set value vector $\bar{v}_{sv}$ and the relationship are established, a deviation vector between the signal parameter vector $\bar{v}_{sp}$ and the set value vector $\bar{v}_{sv}$ is calculated using the relationship, see box 58.

If the values in the deviation vector is acceptable, i.e. each signal parameter value is within a predetermined range of the corresponding set value, the flow proceeds via box 59 to box 60, where the flow ends and the filter is correctly tuned. On the other hand if any value of the deviation vector is outside the predetermined range the flow proceeds to box 61, where the tuning mechanisms of the resonator modules are adjusted in response to the deviation values.

After the adjustment is done, the flow continues to box 62 where a new measurement of the signal parameter vector is performed. The flow is fed back to box 58, where a new deviation vector is calculated using the new signal parameter vector. If the values in the deviation vector is within the predetermined range the flow ends in box 60, otherwise the steps 61 and 62 is repeated until all the values in the deviation vector is within the predetermined range.

This process will now be described using the calculated inverse $A^{-1}$ of the established calibration matrix A as described in connection with FIG. 8, to illustrate how well the method works, although the calibration frequency differs from the actual frequency content of the input signal (s).

The set value vector $\bar{v}_{sv}$ for a filter comprising four cascade coupled resonator modules, where said filter should be tuned for to a filter frequency of 1950 MHz, differs a little from the set value vector at the calibration frequency 1930 MHz which was used in establishing the calibration matrix A. This example will illustrate that the filter will converge to the desired filter frequency through a number of iterations. The set value vector, defining the phase component of the input signal, is:

$$\bar{v}_{sv}(1950 \text{ MHz}) = \begin{bmatrix} 45.5 \\ -15.3 \\ -55.3 \\ -20.8 \end{bmatrix}$$

After coarse tuning the following signal parameter vector $\bar{v}_{sp0}$ was measured:

$$\bar{v}_{sp0} = \begin{bmatrix} 56.8 \\ -23.6 \\ -59.7 \\ -26.8 \end{bmatrix}$$

A deviation vector $\bar{v}_{dev0}$ is then calculated by multiplying the inverse matrix $A^{-1}$ with the measured signal parameter vector $\bar{v}_{sp0}$.

$$\bar{v}_{dev0} = A^{-1} \begin{bmatrix} 56.8 \\ -23.6 \\ -59.7 \\ -26.8 \end{bmatrix} = \begin{bmatrix} 11.3 \\ -8.3 \\ -4.4 \\ -6 \end{bmatrix}$$

The deviation matrix is expressed in deviating frequency within each resonator module. The control unit uses the deviation vector to adjust all tuning mechanisms a number of steps corresponding to the deviating frequency.

A new measurement of the signal parameter vector $\bar{v}_{sp1}$ is performed after the first iteration and the calculation process is repeated again. Table 1 shows the result of the iteration process.

TABLE 1

| Set value $\bar{v}_{sv}$ | After coarse | | After 1st iteration | | After 2nd iteration | | After 3rd iteration | | After 4th iteration | |
|---|---|---|---|---|---|---|---|---|---|---|
| phase | $\bar{v}_{sp0}$ | $\bar{v}_{dev0}$ | $\bar{v}_{sp1}$ | $\bar{v}_{dev1}$ | $\bar{v}_{sp2}$ | $\bar{v}_{dev2}$ | $\bar{v}_{sp3}$ | $\bar{v}_{dev3}$ | $\bar{v}_{sp4}$ | $\bar{v}_{dev4}$ |
| 45.5 | 56.8 | 11.3 | 48.2 | 2.7 | 46.7 | 1.2 | 45.8 | 0.3 | 45.5 | 0 |
| −15.3 | −23.6 | −8.3 | −16.4 | −1.1 | −15.7 | −0.4 | −15.1 | 0.2 | −15.4 | −0.1 |
| −55.3 | −59.7 | −4.4 | −53.9 | 1.4 | −56.7 | −1.4 | −54.8 | 0.5 | −55.2 | 0.1 |
| −20.8 | −26.8 | −6 | −25.3 | −4.4 | −21.3 | −0.5 | −21.1 | −0.3 | −21 | −0.2 |

The iteration process is terminated after 4 iterations in this example, but more iteration may be performed to obtain an even better result.

If an offset is desirable as discussed in connection with FIG. 4, the same process for calculation may be used, towards another set value vector.

FIG. 6 show a flow diagram of a first embodiment for coarse tuning of a filter having at least two cascade coupled resonator modules. The flow starts in box 52, FIG. 5, and continues to box 63, where the amplitude of the signal in the first resonator module, which is connected to the input connection, is measured. The procedure for this step comprises adjusting the tuning mechanism of the first resonator module until a signal is detected within the first resonator module.

This is achieved by measuring the amplitude of the signal in the first resonator module, as indicated in box 63, and the adjusting the tuning mechanism of the first resonator module, as indicated in box 64.

The adjustment of the tuning mechanism in box 64 may be terminated when a signal is detected having an amplitude, but the adjustment process is preferably terminated when the amplitude of the measured signal reaches a threshold value or a maximum value.

The filter frequency is thereafter determined, see box 65, by using a relationship between the position of the tuning mechanism in the first resonator module and the filter frequency, e.g. stored in a memory in the control unit. This relationship may be expressed in a table or as a mathematical expression (such as a polynomial).

When the filter frequency is determined, a target position of the other tuning mechanisms are determined, in box 66, by using a similar relationship as the one described above. The relationship between the tuning mechanism and the filter frequency may be different for each resonator module.

When the target position for each tuning mechanism is determined the flow continues to box 67, where the tuning mechanism for each resonator module is adjusted and the flow returns to box 55 in FIG. 5.

Figure 7:
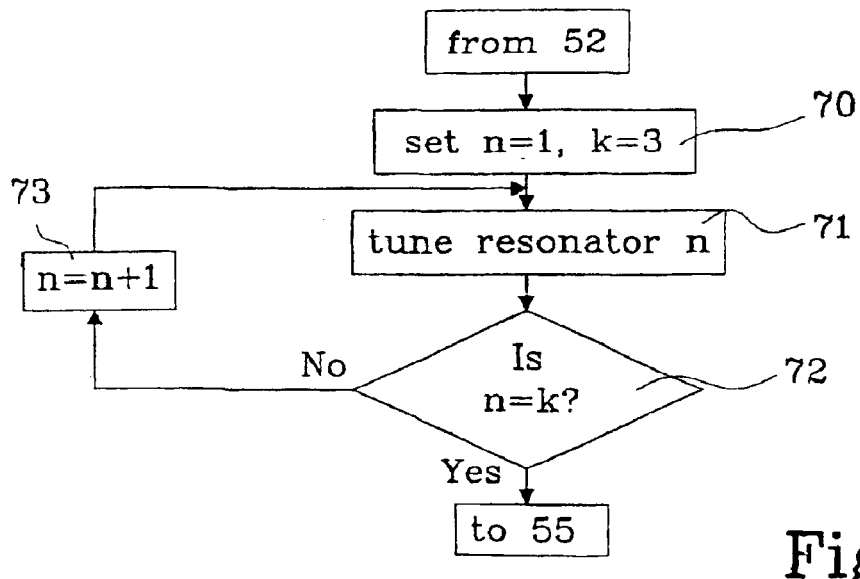
FIG. 7 shows a flow diagram of a second embodiment for coarse tuning a filter according to the invention.

FIG. 7 shows a flow diagram of a second embodiment for coarse tuning a filter according to the invention. The flow starts in box 52, FIG. 5, and continues to box 70, where certain parameters are set. A counter is initiated by setting n=1 and a variable k is set to the present number of cascade coupled resonator modules (in this example 3).

When n and k is set, the flow continues to box 71 where the tuning mechanism for resonator module 1 (n=1) is adjusted until an amplitude is detected within the resonator module. The adjustment process is terminated when a signal is detected having an amplitude, but the adjustment process is preferably terminated when the amplitude of the measured signal reaches a threshold value or a maximum value.

The tuning step is repeated for the next resonator module, se box 72 and 73, unless the previously tuned resonator module is the final resonator module, i.e. n=k. In this case the flow is fed back to box 55, FIG. 5.

As previously disclosed in connection with FIG. 5, an alternative, and preferred, way of determining a relationship between the set value vector and the signal parameter vector is to change the tuning mechanism in each resonator module as described in connection with FIG. 8. This may take place during the fine tuning step or is preferably done prior to the fine tuning or even before the coarse tuning step.

To be able to perform the fine tuning a set value vector $\bar{v}_{sv}$ has to be established, as described in connection with FIG. 5, and a relationship between the set value vector $\bar{v}_{sv}$ and the measured signal parameter vector $\bar{v}_{sp}$ has to be defined.

The relationship may be defined in a number of ways, as described in connection with FIG. 5. A calculation matrix may be defined from computer calculations, directly describing the relationship. Another way is to define a calibration matrix, as described below, and calculate an inverse to the calibration matrix, which can be used in the same way as the calculation matrix.

The defined relationship is a linear relationship within a small frequency range, and instead of providing a plurality of relationships each adapted for a small frequency range, it is preferred that the defined relationship include comprises frequency dependent variables so that the relationship may be used over a large frequency interval.

Figure 8:
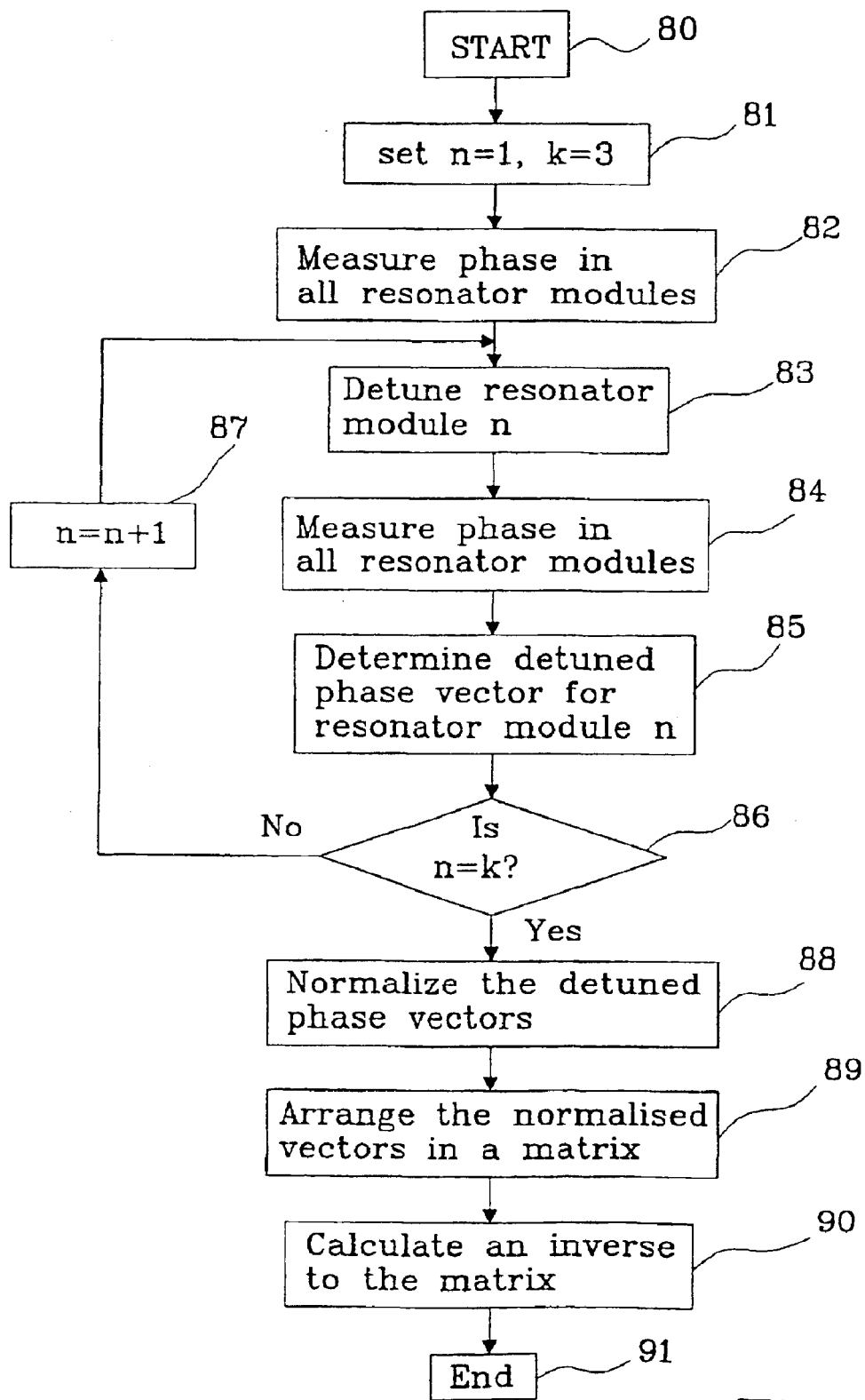
FIG. 8 shows a flow diagram of an embodiment for defining the relationship between the signal parameter vector and the set value vector.

FIG. 8 shows a flowchart illustrating a method for defining a calibration matrix defining the relationship between the set value vector $\bar{v}_{sv}$ and the measured signal parameter vector $\bar{v}_{sp}$.

The flow starts in box 80, and in box 81 a counter n is set to 1, n=1, and a variable k is set to the present number of resonator modules, in this example k=4. The filter is previously tuned to a calibration frequency, which means that a signal close to the calibration frequency will pass through the filter from the input connection to the output connection. If a specific calibration frequency is not used, the coarse tuning of the filter will provide the same thing as the coarse tuning aim to provide a filter where a signal will pass through.

In the next step, box 82, the signal parameters, in this example the phase component of the signal, in all resonator modules are measured to be used as reference values, or in other words, as a set value vector for this frequency. The following set values illustrates an example for a calibration frequency of 1930 MHz:

$$\bar{v}_{sv} = \begin{bmatrix} 45.5 \\ -16.5 \\ -67.1 \\ -22.8 \end{bmatrix}$$

The flow then continuos to box 83, where the tuning mechanism for resonator module n=1 is adjusted, or detuned, a predetermined value which corresponds to a frequency response, in this example 0.5 MHz.

The values of the detuned phase component is thereafter measured in all resonator modules, see box 84, and the measured values are arranged in a detuned phase vector $\bar{v}_{sp1}$ in box 85, where sp1 stands for signal parameter in resonator module 1:

$$\bar{v}_{sp1} = \begin{bmatrix} 41.2 \\ -20.5 \\ -71.0 \\ -26.7 \end{bmatrix}$$

After the measurement, the tuning mechanism of resonator module n is optionally adjusted back to the value before the detuning operation started.

In box 86 the method determines if the previous measurement was made for the final resonator module. If not, the flow is fed back via box 87, where the counter n is increased by 1, and box 83-86 is repeated for n=2.

The tuning mechanism of resonator module 2 is detuned a predetermined value, which may differ from the detuned value of the first resonator module, corresponding to the same frequency response as for the first resonator module. The phase component is measured in all resonator modules, arranged in a vector and the tuning mechanism is adjusted back.

The additional detuned phase vectors was measured when k=4:

$$\bar{v}_{sp2} = \begin{bmatrix} 54.0 \\ -23.6 \\ -74.2 \\ -30.3 \end{bmatrix}; \bar{v}_{sp3} = \begin{bmatrix} 38.0 \\ -12.3 \\ -73.8 \\ -29.4 \end{bmatrix}; \bar{v}_{sp4} = \begin{bmatrix} 52.0 \\ -20.0 \\ -60.8 \\ -27.3 \end{bmatrix}$$

When n=k in box 86, the flow continues to box 88, where the measured detuned phase vectors are normalized by subtracting the set value vector from each detuned phase vector and thereafter dividing it by the frequency response for each detuning.

The final step for achieving a calibration matrix is to arrange the normalized detuned phase vectors in a matrix, as performed in box 89. The resulting calibration matrix has the following values:

$$A = \begin{bmatrix} -8.6 & 17 & -15 & 13 \\ -8 & -14.2 & 8.4 & -7 \\ -7.8 & -14.2 & -13.4 & 12.6 \\ -7.8 & -15 & -13.2 & -9 \end{bmatrix}$$

To be able to use the established calibration matrix, an inverse has to be calculated, which is performed in box 90, having the following values:

$$A^{-1} = \begin{bmatrix} -0.05 & -0.08 & 0.01 & 0 \\ 0.03 & 0 & -0.03 & 0 \\ 0 & 0.05 & 0 & -0.04 \\ 0 & 0 & 0.05 & -0.05 \end{bmatrix}$$

The flow ends in box 91.

The above described process for obtaining a relationship between the set value vector and the measured signal parameter vector is performed by adjusting a tuning mechanism at a time. An alternative way of establishing the relationship is to adjust two tuning mechanisms at a time, as long as the adjustments have a linear independent relationship. This could be obtained by making the adjustments for a filter comprising four resonator modules:

| Linear independent relationship | Tuning mechanism number 1 | Tuning mechanism number 2 | Tuning mechanism number 3 | Tuning mechanism number 4 |
|---|---|---|---|---|
| 1 | +0.5 MHz | +0.5 MHz | — | — |
| 2 | -0.5 MHz | +0.5 MHz | — | — |
| 3 | — | — | +0.5 MHz | +0.5 MHz |
| 4 | — | — | -0.5 MHz | +0.5 MHz |

FIGS. 9–13 illustrates a number of different radio filters where the described tuning method may be applied.

Figure 9:
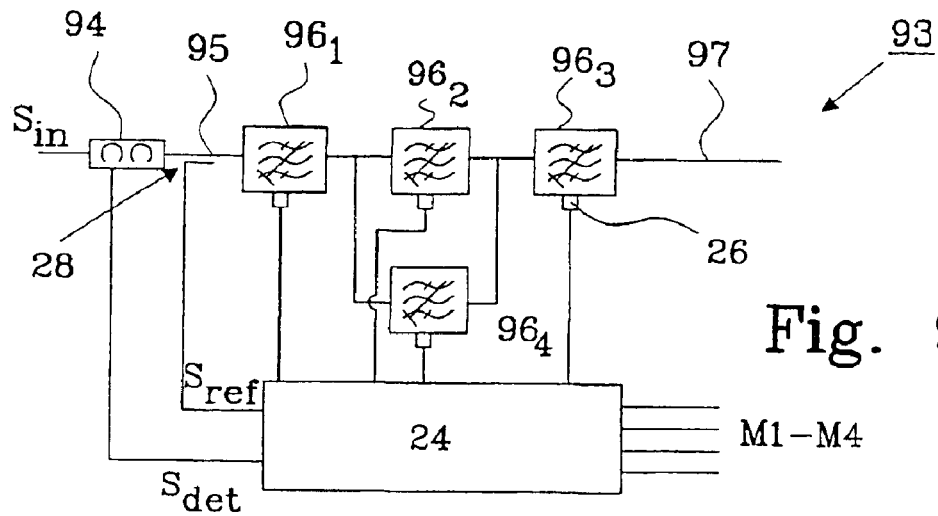
FIG. 9 shows a second embodiment of a filter according to the invention.

FIG. 9 shows a second embodiment of a radio filter 93 according to the invention comprising an isolator circuit 94, provided between a transmitter circuit (not shown) and the input connection 95 to a first resonator module 96$_1$. The first resonator module 96$_1$ is cascade coupled with a second resonator module 96$_2$ and a third resonator module 96$_3$. An additional fourth resonator module 96$_4$ is parallel coupled with the second resonator module 96$_2$ and all present resonator modules are provided with tuning mechanisms (not shown) and probes 26 to measure signal parameters within each resonator module. The third resonator module is connected to an output connection 97.

A control unit 24 is provided, which receive information from the resonator modules from the probes 26 and a sensor 28 at the input connection 95 measures a reference signal $S_{ref}$, as previously described in connection with FIG. 2.

The control unit 24 is also connected to the isolation circuit 94. A detection signal $S_{det}$, which is essentially a small fraction of the input signal(s) $S_{in}$ is forwarded to the control unit. The detection signal is used to detect if a signal is present and to determine the frequency content of the input signal(s).

A relationship between a set value vector and a signal parameter vector may be established in the same way as described in connection with FIG. 8 or in any other way previously mentioned. This relationship makes it possible to control the tuning mechanisms by control signals M1–M4.

Figure 10:
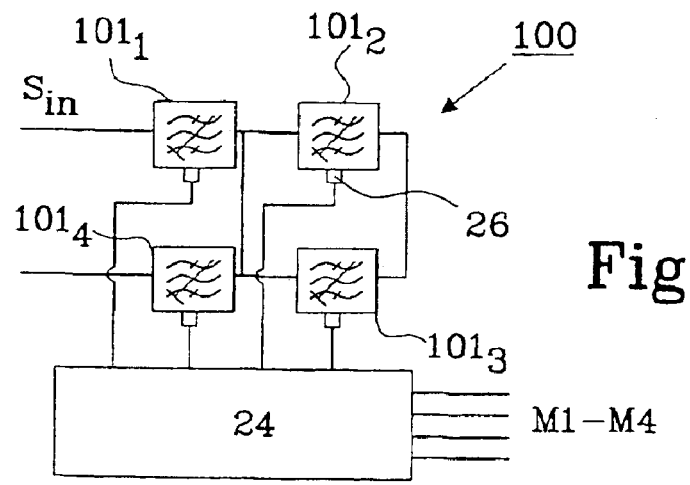
FIG. 10 shows a third embodiment of a filter according to the invention.
Figure 12:
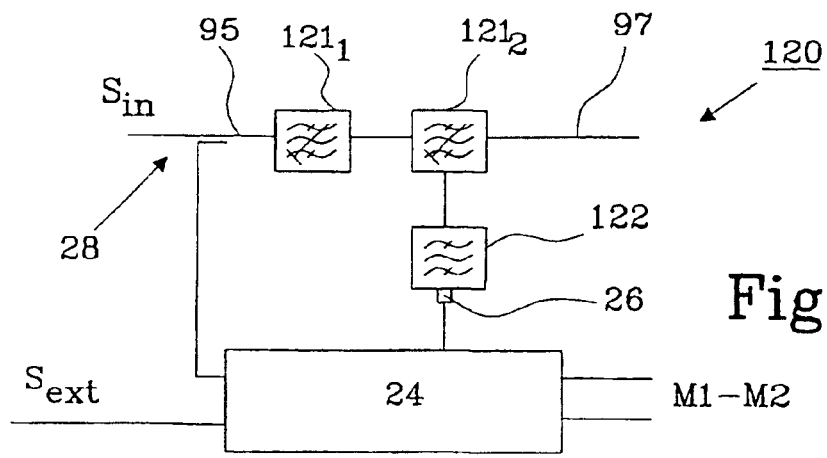
FIG. 12 shows a fifth embodiment of a filter according to the invention.

FIG. 10 shows a third embodiment of a radio filter 100 according to the invention. Only the probes 26, the resonator modules 101$_1$–101$_4$ and the control unit 24 are illustrated. The output of the first resonator module 101$_1$ and the input to the final resonator 101$_4$ are directly connected by a connection 102. The control unit receive information regarding frequency content of the input signal $S_{in}$, which may be done by a sensor, an isolator circuit or as an external signal as illustrated in FIG. 12. A reference signal is not measured in this example. Instead a self generated reference, within the control unit, is used as a reference when measuring the signal parameters at the resonator modules 101$_1$–101$_4$. Control signals M1–M4 are used to tune the filter.

Figure 11:
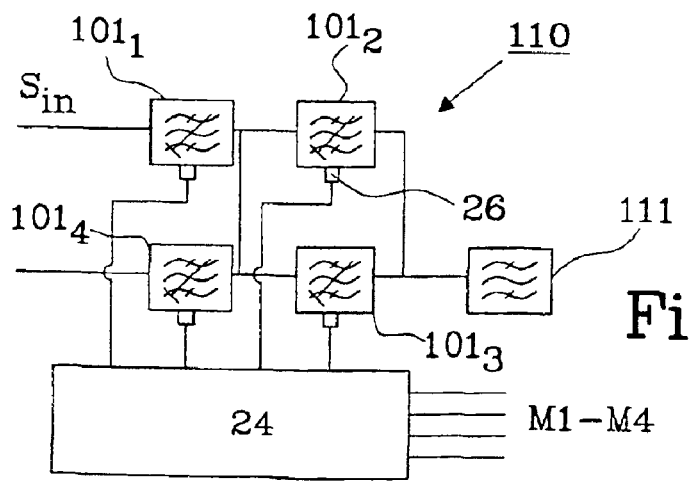
FIG. 11 shows a fourth embodiment of a filter according to the invention.

FIG. 11 shows a fourth embodiment of a radio filter 110 according to the present invention comprising all the features from FIG. 10 and an additional resonator module 111. The additional resonator module 111 is not provided with a tuning mechanism or a probe, and operates as a notch resonator to improve the characteristics of the filter.

The relationship between the set value vector and the signal parameter vector in FIGS. 10 and 11 is the same since the additional resonator module 111 does not affect the tuning of the filter.

FIG. 12 shows a fifth embodiment of a radio filter 120 according to the present invention comprising a control unit 24, an input connection 95 connected to a first resonator module 121₁, an output connection 97 connected to a final resonator module 121₂, a sensor 28 and a non-tunable resonator module 122 being provided with a probe 26. The first and final resonator modules are cascade coupled and each is provided with a tuning mechanism (not shown). Neither resonator module is provided with a probe for measuring signal parameters within them, but the final resonator module 121₂ is connected to the non-tunable resonator module 122. The probe 26 in the non-tunable resonator module 122 is connected to the control unit 24, which means that the signal parameters measured by the probe 26 indirectly is a measurement of the signal parameters within the final resonator module 121₂. The non-tunable resonator module has a known transfer function, as previously discussed.

The control unit 24 is furthermore connected to the sensor 28, to establish a reference value as described in connection with FIG. 2, and to an external signal $S_{ext}$, which provide the control unit with information regarding the filter frequency, the so called filter frequency parameter. By using this information the coarse tuning of the filter may be performed and thereafter the fine tuning. Control signals M1–M2₂ are used to tune the filter 120.

Figure 13:
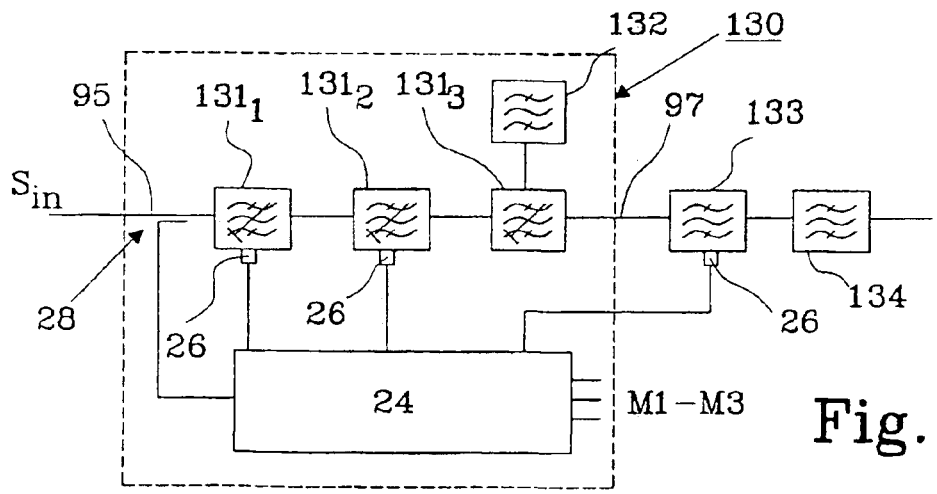
FIG. 13 shows a sixth embodiment of a filter according to the invention.

FIG. 13 shows a sixth embodiment of a radio filter 130 according to invention comprising a control unit 24, an input connection 95 connected to a first resonator module 131₁, an output connection 97 connected to a final resonator module 131₃, a second resonator module 131₂ connected between the first and the final resonator modules, a sensor 28 and a non-tunable resonator module 132.

The first, second and final resonator module 131₁–131₃ are provided with a tuning mechanism (not shown), but only the first and the second resonator is provided with a probe 26. The non-tunable resonator module 132 is connected to the final resonator module 131₃ as a notch resonator. The output connection 97 is connected to a second non-tunable resonator module 133, which is provided with a probe 26, cascade coupled to a third non-tunable resonator module 134. The output from the third non-tunable resonator module is connected to an antenna system (not shown).

The control unit 24 receive signals from the sensor 28, as described in connection with FIG. 2, the probe 26 at the first and the second resonator module 131₁, 131₂ and from the probe 26 provided on the non-tunable resonator module 133 (indirectly measuring the signal parameters within the final resonator module 131₃). These measurements and the determined relationship between the set value vector and the measured signal parameter vector decides the control signals M1–M3.

Figure 14:
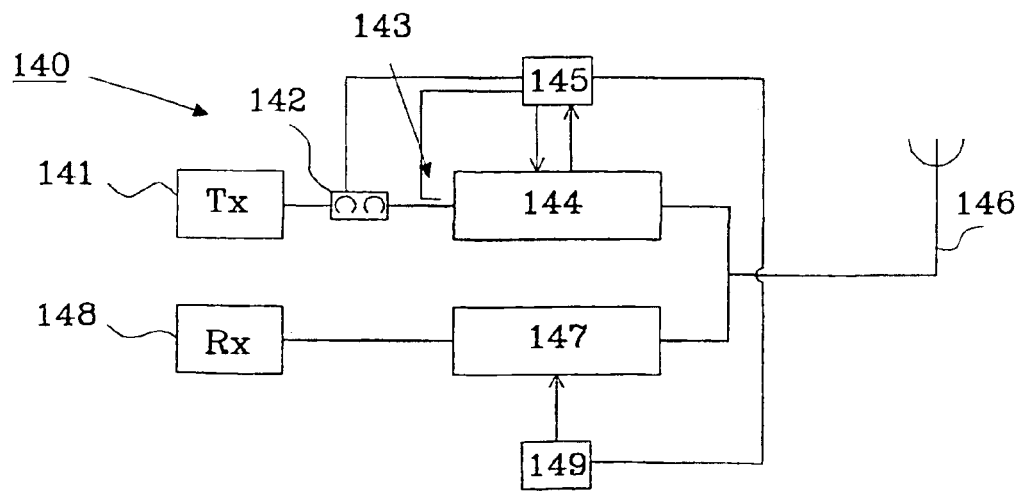
FIG. 14 shows a first embodiment of a system including two filters according to the invention.
Figure 15:
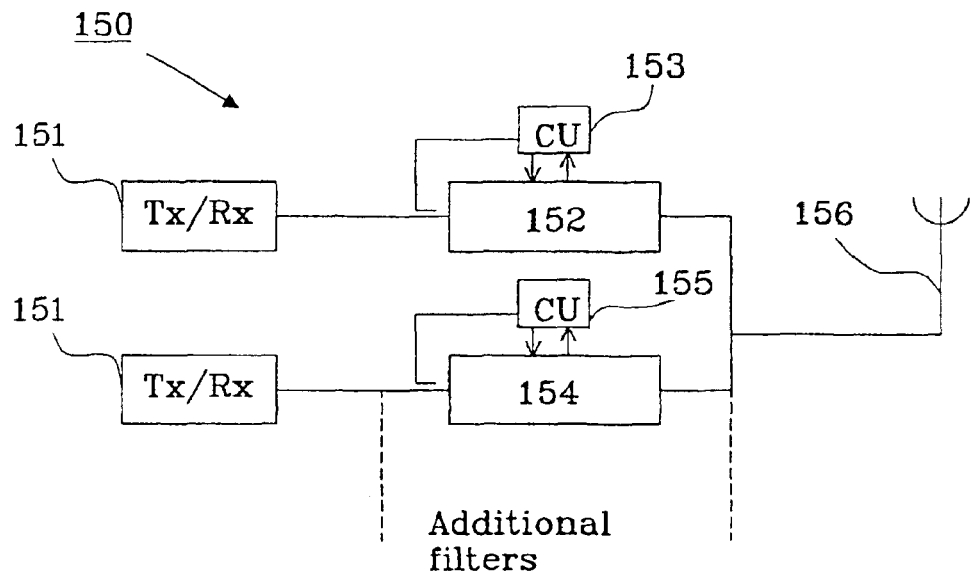
FIG. 15 shows a second embodiment of a system including two filters according to the invention.

FIGS. 14 and 15 describe two different embodiments of a radio system comprising a radio filter according to the invention.

FIG. 14 shows a first embodiment of a radio system 140, comprising a transmitter 141, connected to an isolator circuit 142, a sensor 143 being connected between the isolator circuit 142 and a first filter 144, and a control unit 145 being connected to the isolator circuit 142, the sensor 143 and the first filter 144. An output connection from the first filter is connected to an antenna 145.

The control unit senses the frequency content of the signal from the transmitter 141 and tunes automatically the filter 144, as previously described.

The system 140 further comprises a second filter 147 being connected between said antenna 146 and a receiver 148, and a slave unit 149 being connected to said control unit 145 and said second filter 147. The control unit 145 provides the slave unit 149 with information regarding tuning values for the resonator modules within the second filter 147. This may be determined in some systems where there is a predetermined frequency shift between the transmitting link and the receiving link.

FIG. 15 shows a second embodiment of a radio system 150 comprising a first transceiver 151 connected to a first filter 152 with a control unit 153, a second transceiver 157 connected to a second filter 154 with a control unit 155 and an antenna system 156. Each control unit 153 and 155 controls the respective filter as previously described. The antenna system 156 is connected to an output connection of both said first and second filters 152 and 154.

The coupling structure is a combiner structure, as described in FIG. 1, with the exception that each resonator module in FIG. 1 is replaced with a filter according to the invention. Additional filters and corresponding transceivers may be connected in parallel with the first and second filter.

Figure 16:
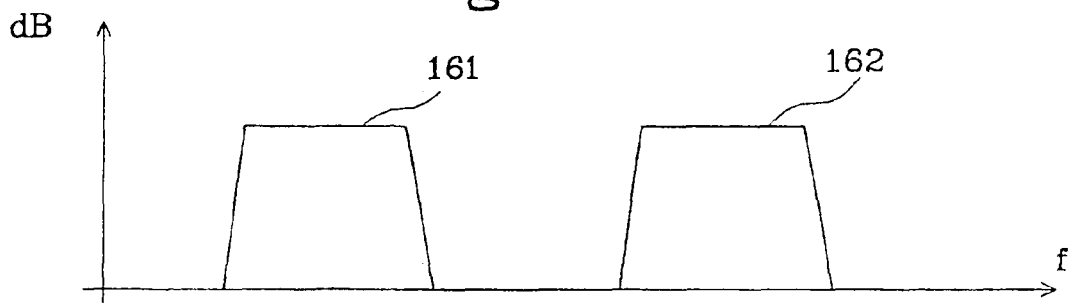
FIG. 16 shows a frequency diagram illustrating a system function.

Each filter may be tuned to a separate frequency, and thereby create a system function as illustrated in FIG. 16. The x-axis is frequency f and the y-axis is transmission in dB. The system function comprises two separate filter functions 161 and 162.

Figure 17:
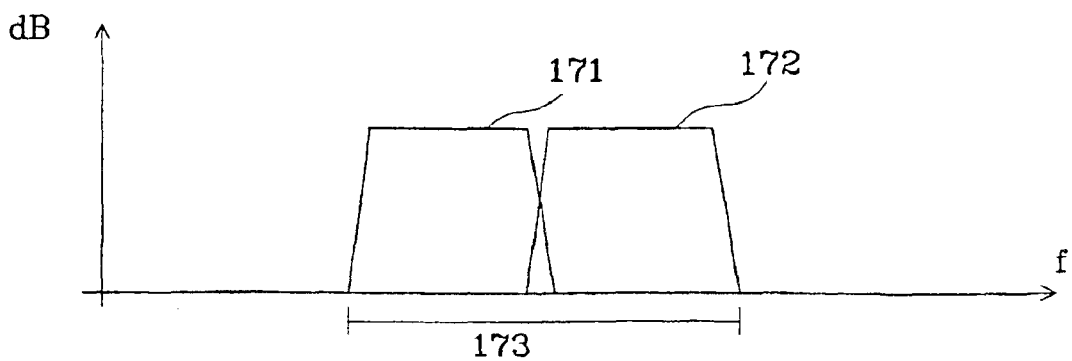
FIG. 17 shows a frequency diagram illustrating an alternative system function.

Another frequency diagram is shown in FIG. 17, where the x-axis is frequency f in Hz and the y-axis is transmission in dB. In this case the filter function 171 and 172 overlap each other thereby creating a broader system function 173.

Although most examples indicate that the signal parameter inside the resonator module is directly measured, this is normally not the case. A cable or even a fixed resonator module, as shown in FIGS. 11 and 12 may be connected between the control unit and the resonator module where the signal parameter is sought. A cable has a predetermined transfer function, which means that the control unit easily can calculate the signal parameter in the resonator module by subtracting the transfer function from the measured signal parameter. The same may be achieved with a fixed resonator module, which also has a predetermined transfer function. The wording in the appended claims, concerning measurements of the signal parameter using a probe, is intended to include measurements via a cable, a fixed resonator module and/or any other transmission device having a predetermined transfer function.

Further, the described embodiments of the present invention illustrate a probe being attached to each resonator, but the scope of the invention should not be limited to this. Any type of probe or sensor that may be used to measure signal parameters at each resonator, e.g. sensors provided at the output of the resonators, probes provided within the resonators, may be used.

In the embodiments described above where all tunable resonator modules are provided with a probe, it is possible to tune the filter to a specific filter frequency, even though the measured signal parameter from a resonator module is faulty. This may be the case when a probe is damaged and the measured signal parameter is not representative to the actual signal parameter present within the resonator module.

Simulations have shown that when this occurs, the filter will still converge after an increased number of iterations, such as ten times as many as usual, due to that the used matrix include additional information regarding all present tunable resonator modules and their internal relationship.

The radio filter is preferably operational in a frequency range between 100 MHz and 3 GHz, but may operate at a frequency of 3 GHz or higher. A radio filter may be any type of filter working in the microwave range, including radio filters designed for telecommunication purposes, such as telephony and data communications.

What is claimed is:

1. A method for tuning a radio filter, said filter being operable in a frequency range and comprising an input connection, an output connection and at least two resonator modules, each of said at least two resonator modules having a tuning mechanism, said filter being adapted to receive at least one signal, having a frequency content, being within said frequency range, characterized in that the method is performed with a radio filter having at least two of said resonator modules coupled in cascade, whereof a first resonator module being connected to said input connection and a final resonator module being connected to said output connection, at least said final resonator module having a probe for measuring a signal parameter at the resonator module, said method comprising the steps of:

determining a filter frequency parameter which corresponds to the frequency content of said received at least one signal, coarse tuning each resonator module by adjusting each tuning mechanism to a tuning value, which depends on said filter frequency parameter, fine tuning said filter by establishing a signal parameter vector comprising said signal parameters being measured at the respective resonator modules, establishing a set value vector comprising a set value for said signal parameter at each resonator tunable module, defining a relationship between said set value vector and said signal parameter vector, calculating a deviation between the set value vector and the measured signal parameter vector by using the defined relationship, and adjusting the tuning mechanism in response to the result of the calculation.

2. The method according to claim 1, where the method is performed with a radio filter where said first resonator module has a probe for measuring a signal parameter at said first resonator module, wherein the step of coarse tuning comprises the steps of:

adjusting the position of the tuning mechanism of said first resonator module, when the at least one received signal is present on said input connection, until a signal also is present within said first resonator module, by measuring the amplitude of the signal with said probe, determining the filter frequency parameter by using a relationship between the position of the tuning mechanism in said first resonator module and the frequency content of said received signal(s), establishing a target position of each tuning mechanism by using a relationship between the position of the tuning mechanism for each resonator module and the filter frequency parameter, respectively, and adjusting the tuning mechanisms to the target position in the resonator modules, respectively.

3. The method according to claim 2, wherein said relationship between the position for each tuning mechanism and the filter frequency parameter is independently expressed for each resonator module.

4. The method according to claim 2, wherein said relationship between the position of each tuning mechanism and the filter frequency parameter is determined by a mathematical expression, or as values in a table.

5. The method according to claim 1, where the method is performed with a radio filter where all resonator modules have a probe for measuring a signal parameter at each resonator module, wherein the step of coarse tuning comprises the steps of:

adjusting the position of the tuning mechanism sequentially in all resonator modules, starting with the tuning mechanism of said first resonator module, which is connected to said input connection, when the at least one received signal is present on said input connection, until a signal is detected within the respective resonator module, by measuring the amplitude of the signal with the respective probe.

6. The method according to claim 2, wherein said adjustment of the position of the tuning mechanism, in the coarse tuning step, is terminated when the amplitude exceeds a predetermined threshold value.

7. The method according to claim 2, wherein said adjustment of the position of the tuning mechanism, in the coarse tuning step, is terminated when the amplitude reaches its maximum value.

8. The method according to claim 1, wherein said frequency content determines a discrete filter frequency and the step of coarse tuning comprises the steps of:

establishing the position of the tuning mechanism in each resonator module by using a relationship between the position of the tuning mechanism for each resonator module and the filter frequency parameter, respectively, and adjusting the position of the tuning mechanisms in the resonator modules in accordance thereto.

9. The method according to claim 8, wherein said filter frequency parameter is determined by measuring the frequency of the input signal(s) in a measurement circuit provided on the input connection or is provided as an external signal.

10. The method according to claim 1, wherein said step of defining a relationship between the set value vector and the signal parameter vector is performed before the other steps of the fine tuning process.

11. The method according to claim 1, wherein said relationship between the set value vector and the signal parameter vector is defined as a calculation matrix and the calculation step to obtain said deviation is performed by multiplying the calculation matrix with the measured signal parameter vector.

12. The method according to claim 11, wherein said calculation matrix is obtained as an inverse to a calibration matrix, which defines a linear relationship, within a frequency interval, between said set value vector and said signal parameter vector.

13. The method according to claim 11, wherein at least one of said calculation matrix and calibration matrix is established through computer simulations, measurements, estimations or mathematical models.

14. The method according to claim 12, wherein said calibration matrix is established by the steps of:

determining set values for the tuning mechanism of each tunable resonator module in a tuned filter at a specific calibration frequency, measuring the phase of the signal within each tunable resonator module for the tuned filter, thereby obtaining a set value phase vector for the filter, detuning all tuning mechanisms a predetermined value, corresponding to a frequency response, to obtain the same number of linear independent relations as there are tunable resonator modules, measuring the phase of the signal within each tunable resonator module for each detuning, thereby obtaining a number of detuned phase vectors corresponding to the number of present tunable resonator modules, normalizing the detuned phase vectors by subtracting the set value phase vector from each detuned phase vector and thereafter dividing it by the frequency response for each detuning, and arranging the normalized detuned phase vectors in a matrix form.

15. The method according to claim 14, wherein said step of detuning all tuning mechanisms is performed by detuning the tuning mechanisms one at a time.

16. The method according to claim 11, wherein several calculation matrices or calibration matrices are provided, each being calibrated to a different frequency within said frequency range, said fine tuning step further comprising the step of:

selecting the calculation and/or calibration matrix having a calibration frequency as close as possible to said filter frequency.

17. The method according to claim 11, wherein said calculation matrix or calibration matrix comprises components being frequency dependent.

18. The method according to claim 14, wherein said calibration frequency differs from said filter frequency.

19. The method according to claim 1, wherein said fine tuning step is an iterative process, whereby another measurement of the signal parameter vector is performed after the tuning mechanism is adjusted in response to the result of the calculation step, and another calculation of said deviation and corresponding adjustment of the tuning mechanism are performed, these steps being repeated until the calculated deviation falls below a predetermined value.

* * * * *